(12) United States Patent
Melanson

(10) Patent No.: US 7,626,360 B2
(45) Date of Patent: Dec. 1, 2009

(54) CHARGE-PUMP BIASED BATTERY PROTECTION CIRCUIT

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 450 days.

(21) Appl. No.: 11/609,894

(22) Filed: Dec. 12, 2006

(65) Prior Publication Data

US 2008/0048618 A1    Feb. 28, 2008

Related U.S. Application Data

(60) Provisional application No. 60/822,193, filed on Aug. 11, 2006.

(51) Int. Cl.
*H02J 7/00* (2006.01)
*H02J 7/04* (2006.01)

(52) U.S. Cl. .............. 320/134; 320/135; 320/137; 320/127; 320/128; 320/136

(58) Field of Classification Search .......... 320/134, 320/136, 137, 127, 128, 140, 135
See application file for complete search history.

(56) References Cited

U.S. PATENT DOCUMENTS

| | | | |
|---|---|---|---|
| 5,539,299 A | 7/1996 | Fernandez et al. | |
| 5,672,952 A * | 9/1997 | Szepesi | 320/164 |
| 5,804,944 A | 9/1998 | Alberkrack et al. | |
| 5,835,989 A | 11/1998 | Nagai | |
| 5,880,576 A | 3/1999 | Nagai | |
| 5,933,046 A | 8/1999 | Ramet et al. | |
| 5,936,384 A | 8/1999 | Fujiwara et al. | |
| 6,121,752 A | 9/2000 | Kitahara et al. | |

(Continued)

FOREIGN PATENT DOCUMENTS

CN    1658469 A    8/2005

(Continued)

OTHER PUBLICATIONS

Unitrode UCC3958 Datasheet, 1999.

(Continued)

*Primary Examiner*—Edward Tso
*Assistant Examiner*—Alexis Boateng
(74) *Attorney, Agent, or Firm*—Andrew M. Harris; Mitch Harris, Atty at Law, LLC

(57) ABSTRACT

A charge-pump biased battery protection circuit provides improved efficiency, reduced power dissipation, and reduced complexity in battery powered circuits. A charge pump is utilized to bias the gate of a single pass transistor such that the voltage between the pass transistor gate and the drain/source terminals of the pass transistor have a magnitude greater than the battery voltage, reducing the voltage drop across the pass transistor. The charge pump may be controlled in conformity with a sensed current through the pass transistor, so that at times of lower current loads, power is conserved. The bulk (body) of the pass transistor can be controlled using a resistor coupling a battery terminal to the bulk and a single switch coupling the bulk to a charger/load connection terminal, permitting a single pass transistor to be used for charging and discharging.

19 Claims, 4 Drawing Sheets

U.S. PATENT DOCUMENTS

| | | | |
|---|---|---|---|
| 6,316,915 B1 | 11/2001 | Fujiwara et al. | |
| 6,340,889 B1 | 1/2002 | Sakurai | |
| 6,400,209 B1 | 6/2002 | Matsuyama et al. | |
| 6,495,989 B1 | 12/2002 | Eguchi | |
| 6,501,248 B2 | 12/2002 | Fujiwara | |
| 6,563,292 B2 | 5/2003 | Fujiwara et al. | |
| 6,580,250 B1 | 6/2003 | Stellberger et al. | |
| 6,661,200 B2 | 12/2003 | Odaohhara | |
| 6,670,790 B2 | 12/2003 | Stellberger | |
| 6,687,103 B2 | 2/2004 | Pannwitz | |
| 6,710,992 B2 | 3/2004 | Pannwitz et al. | |
| 6,710,995 B2 | 3/2004 | Knoedgen | |
| 6,768,289 B2 | 7/2004 | Fujiwara | |
| 6,791,809 B2 | 9/2004 | Pannwitz | |
| 6,798,171 B2 | 9/2004 | Sakurai | |
| 6,801,098 B2 | 10/2004 | Ozawa et al. | |
| 6,803,745 B2 | 10/2004 | Nishida et al. | |
| 6,804,098 B2 | 10/2004 | Pannwitz | |
| 6,812,673 B2 | 11/2004 | Fujiwara | |
| 6,940,256 B2 | 9/2005 | Sakurai | |
| 6,967,488 B1 | 11/2005 | Arigliano | |
| 7,012,405 B2 | 3/2006 | Nishida et al. | |
| 7,030,591 B2 | 4/2006 | Stellberger | |
| 7,034,580 B2 | 4/2006 | Yano et al. | |
| 7,068,484 B2 | 6/2006 | Kashine | |
| 7,085,338 B2 | 8/2006 | Huelss | |
| 7,091,697 B2 | 8/2006 | Mader et al. | |
| 2005/0040792 A1* | 2/2005 | Nair | 320/162 |
| 2007/0097572 A1 | 5/2007 | Wu | |

FOREIGN PATENT DOCUMENTS

| | | | |
|---|---|---|---|
| CN | 1677788 A | 10/2005 | |
| EP | 0626745 B1 | 3/1999 | |
| EP | 0729185 B1 | 7/2004 | |

OTHER PUBLICATIONS

Electronics Talk:Alcatel News Release, "Battery Protection chips can be welded into packs", retrieved on Jul. 11, 2006 from Internet <URL:http://www.electronicstalk.com/news/ala/ala116.html>.

Intersil ISL9212 Datasheet, May 8, 2006.

Maxim DS2720 Datasheet, May 8, 2006.

Conner, "Chip Offers Authentication, protection to single-cell Battery Packs", Electronic Design News, Jun. 30, 2006, retrieved from Internet on Jul. 11, 2006, <URL:http://www.edn.com/index.asp?layout=articlePrint&articleID=CA6348791>.

Microchip PS7051/PS7052 Datasheet, 2004 Microchip Technology.

National Semiconductor News Release, "National Semiconductor Introduces Miniature Battery Mangement and Protection ICS for Portable Systems", retrieved from Internet on Jul. 11, 2006, <URL:http://www.national.com/news/item/0,1735,1054,00.html>.

Ricoh R540XX Datasheet, , retrieved from Internet on Jul. 10, 2006, <URL:http://www.ricoh.com/LSI/product_power/bmu/r540xx/index.html>.

Seiko CMOS Product Catalogue, 2005-2006.

Texas Instruments UCC3952 Datasheet, Aug. 2000.

Texas Instruments UCC3857 Datasheet, Sep. 2002.

Seiko Power Supply S-8261 Datasheet, date 2006.

Seiko Power Supply ICs Datasheets, dated 2006.

Seiko S8241 Datasheet, , retrieved from Internet on Jul. 10, 2006, <URL:http://speed.sii.co.jp/pub/compo/ic/en/product1.isp?subcatID=5&productID=389>.

Elder, Reducing Real Estate in Protecting Single-Cell Li-Ion Batteries, Texas Instruments, dated 2006.

* cited by examiner

CHARGE-PUMP BIASED BATTERY PROTECTION CIRCUIT

CROSS-REFERENCE TO RELATED APPLICATIONS

This application is related to U.S. provisional application Ser. No. 60/822,193, filed Aug. 11, 2006 by the same inventor, and from which it claims benefits under 35 U.S.C. §119(e).

BACKGROUND OF THE INVENTION

1. Field of the Invention

The present invention relates generally to battery protection circuits, and more specifically, to a charge-pump biased battery protection circuit having reduced leakage, improved efficiency and reduced complexity.

2. Background of the Invention

Devices incorporating rechargeable batteries, such as Lithium ion ($Li^+$) batteries and Nickel metal hydride (NiMH) batteries, typically incorporate circuits that protect the battery during charging and discharging. U.S. Pat. No. 6,670,790 to Stellberger, incorporated herein by reference, details several such battery protection circuits, which typically include one or more pass transistors with gate control electronics that limit the current during discharging and charging of the battery. The protection circuits also typically completely disables the discharging action when the battery output voltage falls to too low a level, i.e., when the internal resistance of the battery rises too high due to the level of discharge.

However, such battery protection circuits are inefficient in that the voltage drop across the pass transistor is substantial, causing a waste of available battery energy as dissipation in the pass transistor during discharge. In particular, during intervals of high current drain, the energy loss and power dissipation due to the pass transistor voltage drop are typically substantial. The result is reduced battery cycle life as well as a requirement for pass transistors and/or heat management with the capability to handle the dissipation during such intervals, making it difficult to integrate such circuits on a die with other circuits.

In the improvement introduced in the above-incorporated U.S. Patent Application, the number of required pass transistors is reduced to one, by control of the bulk (body) voltage of a single enhancement field-effect transistor (FET) so that conduction can be provided in either direction through the pass transistor. However, the management of the bulk voltage requires two switches as shown in FIG. 2 of the above-incorporated U.S. patent application and the separate control of the switches introduces further complexity in the control circuit. Further, the voltage drop across even a single FET can still have a significant impact on efficiency and power dissipation during intervals of heavy discharge.

Therefore, it would be desirable to provide a battery protection circuit that has improved efficiency and reduced power dissipation. It would further be desirable to provide such a battery protection circuit that uses a single pass transistor, but has reduced control circuit complexity.

SUMMARY OF THE INVENTION

The above stated objectives of providing a battery protection circuit having improved efficiency, reduced power dissipation and that uses a single pass transistor with a reduced-complexity control circuit, are accomplished in a charge-pump biased battery protection circuit.

The battery protection circuit includes a pair of battery terminals for connecting a battery and a pair of input/output terminals for alternatively connecting one of a charger or a load, depending on whether the battery is being charged or used to power the load (discharged). A pass transistor is coupled between one of the battery terminals and the input/output terminals for controlling current passing between the battery and the charger or load. A charge pump supplies a voltage to the gate of the pass transistor so that the voltage between the gate and drain/source terminals of the transistor has a magnitude greater than the voltage across the battery terminals, providing a reduced voltage drop across the pass transistor. The charge pump voltage may be reduced during times of lower current drain as measured by a current-sensing circuit.

The bulk (body) of the pass transistor is controlled in conformity with the current flow direction through the pass transistor, so that the bulk is biased to prevent conduction with the drain/source connections. A resistor is coupled between the bulk and the battery terminal that is connected to the drain/source connection of the pass transistor. A single switch is coupled between the bulk and the input/output terminal that is connected to the other drain/source connection of the pass transistor. Controlling the switch controls the current flow through the pass transistor.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a battery protection circuit for incorporation within battery-powered devices, and in particular, that can be incorporated within an integrated circuit. The battery protection circuit provides improvement in that a single pass transistor having a smaller area can be used and/or a lower voltage drop is provided across the pass transistor, raising the efficiency of the circuit while lowering power dissipation. Further, the increase in gate to drain/source connection voltage increases the breakdown voltage of the circuit, which aids in preventing damage due to improper charger voltage application to the charger terminals or in the case of charger failure or over-voltage conditions. A charge pump is used to raise the gate voltage of the pass transistor to a voltage level beyond the range of the battery/ charger power supply voltages, so that the resistance of the pass transistor is reduced during charging and discharging of the battery. The charge pump may be disabled during low current discharge conditions, so that battery power is not wasted operating the charge pump when the power consumed by the charge pump approaches that of the power savings in the pass transistor.

Figure 1:
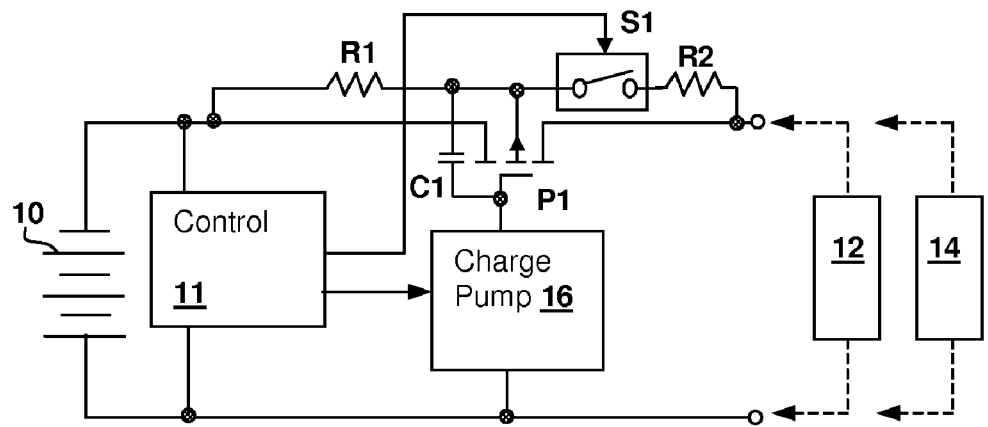
FIG. 1 is a schematic diagram depicting a battery protection circuit in accordance with an embodiment of the invention.

Referring now to FIG. 1, a battery protection circuit in accordance with an embodiment of the present invention is shown. A battery 10 is coupled to either a load 12 or a charger 14, depending on whether the battery is being charged by the charger or discharged to the load, by a pass transistor P1, which in the depicted embodiment is an enhancement mode field effect transistor (FET). A charge pump 16, provides for charging the gate of pass transistor P1 to a voltage beyond the range of the voltage of battery 10, providing for a gate voltage that turns on transistor P1. In the depicted embodiment, the output of charge pump 16 is a negative voltage less than the voltage at the negative terminal of battery 10. However, it is understood that an N-channel FET may be used to provide battery protection, and would then be connected between the negative terminal of battery 10 and the negative input/output terminal that connects to load 12 or charger 14. In such an embodiment, the charge pump voltage is a positive level exceeding that of the battery 10 positive terminal voltage.

A control circuit 11, provides control of charge pump 16 so that charge pump is only activated during times of charging or during high current discharge conditions, so that power is not wasted operating charge pump 16 when little or no current is being drained from battery 10. Details of various discharge sensing arrangements will be described below with reference to FIGS. 2-4. When charger 14 is not connected or is not powered, switch S1 disconnects a path through resistor R2 to the positive input/output terminal in response to control circuit 11. When charger 14 is supplying a charging voltage, switch S1 is closed. Resistor R2 may not be needed, depending on the resistance of switch S1. Resistor R1 couples the bulk of transistor P1 to battery 10, so that when switch S1 is open or when switch S1 is closed and no charger is connected, the body of transistor P1 is held at the positive terminal voltage of battery 10. Switch S1 is deactivated when battery 10 is in a discharged state, so that further discharge does not occur through a connected charger 14, if charger 14 is connected but un-powered. A capacitor C1 may be provided to stabilize the bulk voltage of transistor P1, which otherwise may be pulled below the drain/source connection voltages, for example, when a momentary short-circuit or reverse charger polarity is caused across the input/output terminals.

Figure 2:
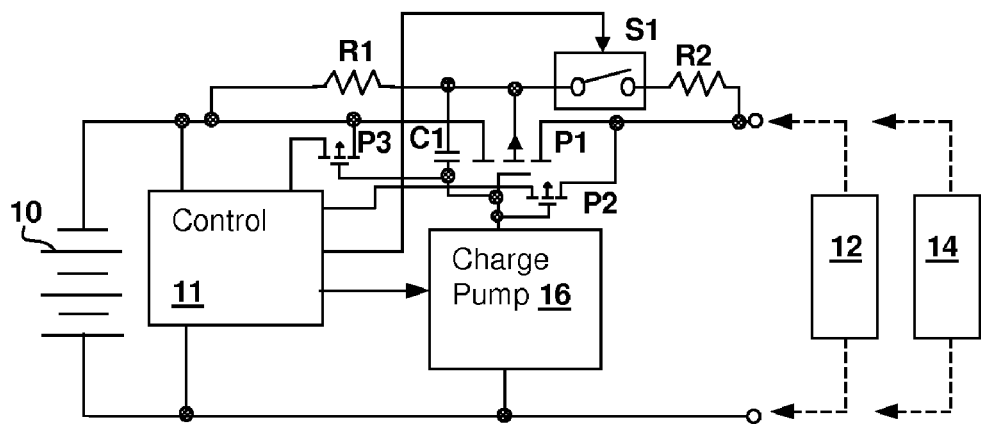
FIG. 2 is a schematic diagram depicting a battery protection circuit in accordance with another embodiment of the invention.

Referring now to FIG. 2, a battery protection circuit in accordance with another embodiment of the invention is shown. The depicted embodiment is similar in structure and function to the embodiment of FIG. 1, and therefore only differences between them will be described below. In the embodiment of FIG. 2, a current sensing circuit that can provide an indication of pass transistor drain-source current level to control circuit 11 is included. Current sensing is provided by two current mirrors implemented by transistors P2 and P3. Transistors P2 and P3 are sized much smaller than transistor P1, and provide currents to control circuit 11 that are proportional to the current through transistor P1 while transistor P1 is operating in the active region in either direction. Transistor P2 is utilized to sense the current through transistor P1 during charging, and transistor P3 is utilized to sense the current through transistor P1 when battery 10 is being discharged. Control circuit 11 then can compare the appropriate current indication to threshold levels to determine when the current level provided to load 12 is low enough that it is advantageous to disable charge pump 16 to save power.

Figure 3:
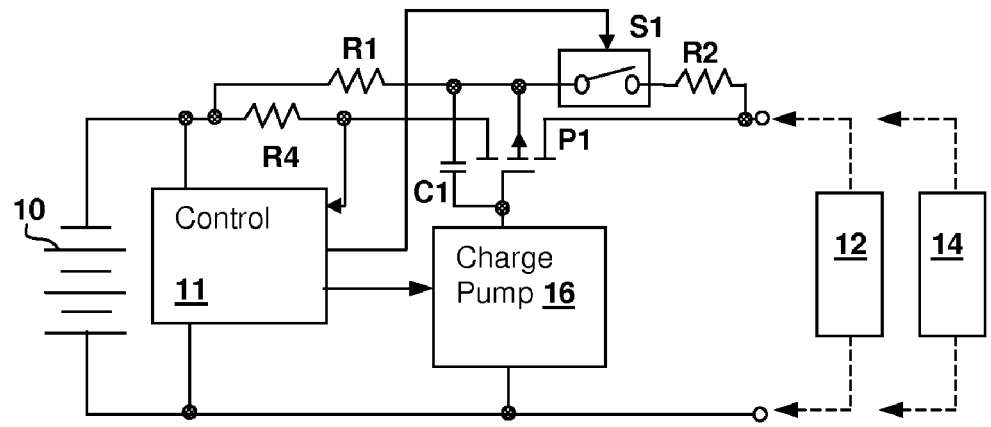
FIG. 3 is a schematic diagram depicting a battery protection circuit in accordance with yet another embodiment of the invention.

Referring now to FIG. 3, a battery protection circuit in accordance with yet another embodiment of the invention is shown. The depicted embodiment is similar in structure and operation to the embodiment of FIGS. 1 and 2, and therefore only differences between them will be described below. In the embodiment of FIG. 3, another current sensing circuit that can provide an indication of pass transistor drain-source current level to control circuit 11 is included. Current sensing is provided by a series resistor R4. The voltage drop across resistor R4 is detected by control circuit 11 to directly measure the current through transistor P1.

Figure 4:
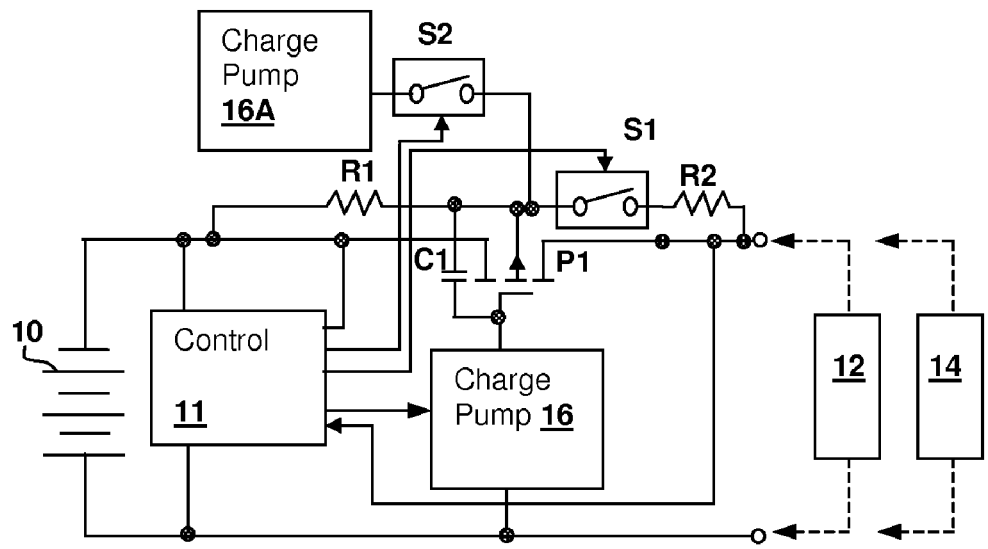
FIG. 4 is a schematic diagram depicting a battery protection circuit in accordance with still another embodiment of the invention.

Referring now to FIG. 4, a battery protection circuit in accordance with still another embodiment of the invention is shown. The depicted embodiment is similar in structure and operation to the embodiment of FIGS. 1-3, and therefore only differences between them will be described below. In the embodiment of FIG. 4, another current sensing circuit that can provide an indication of pass transistor drain-source current level to control circuit 11 is included. Current sensing is provided by directly measuring the voltage drop across the drain/source connections of transistor P1. The drain-source voltage drop is detected by control circuit 11 to directly measure the current through transistor P1, taking into account whether or not charge pump 16 is boosting the gate voltage of transistor P1.

A second charge pump 16A is included to boost the bulk voltage of transistor P1 to a voltage higher than the voltage at the positive terminal of battery 10, in particular when the battery is discharged, so that pass transistor P1 is biased further into the cut-off region. Optionally, during times of high current drain in the discharging state, charge pump 16A can set the bulk voltage of pass transistor P1 to a level slightly below that of the drain/source connections of transistor P1, so that the junctions between the body and the drain/source elements is biased just below turn-on. Biasing the junctions in this manner produces a behavior similar to that of a junction FET (JFET), further reducing the on-resistance of transistor P1. A switch S2 is provided to de-couple charge pump 16A during charging and during discharge if charge pump 16A is not utilized to bias the gate of transistor P1 below the drain/source connections of transistor P1.

Figure 5:
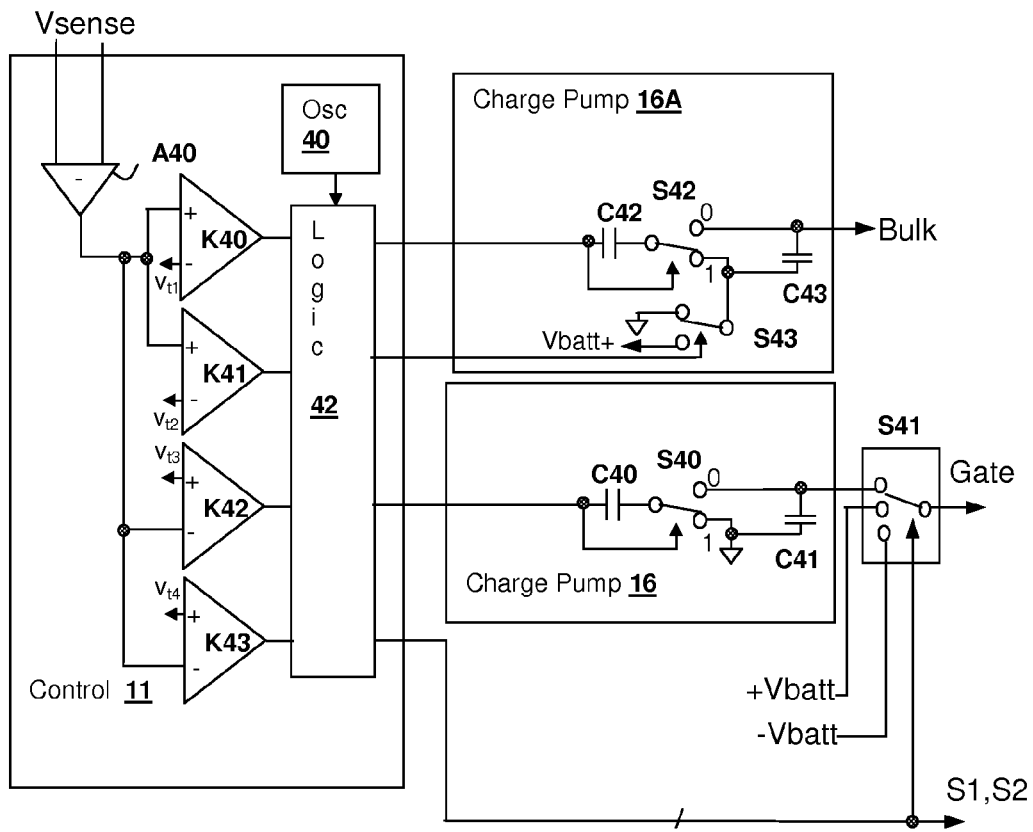
FIG. 5 is a schematic diagram depicting a control circuit that may be used to implement control circuit 11 of FIGS. 1A, 1B, 2A, and 2B.

Referring now to FIG. 5, an exemplary control circuit 11 and charge pumps 16, 16A are shown, as may be used in the above-illustrated battery protection circuits. Control circuit 11 includes a logic 42 that controls switches S40, S42 and S43 of charge pumps 16, 16A, as well as a switch S41 that controls the application of the output of charge pump 16 to the gate of pass transistor P1. Switch S41 selects between the output of charge pump 16 during heavy discharge, ground (−Vbatt) during periods of light discharge and (+Vbatt) to turn off transistor P1 when the battery is discharged below a minimum charge level or when the battery is charged above a maximum charge level. The sense voltage Vsense provided by one of the techniques illustrated in the circuits of FIGS. 1-4 is compared to a set of threshold voltages $V_{t1}$-$V_{t4}$ by a set of corresponding comparators K1-K4 that determine whether the battery is charging or discharging, and further whether the battery is over-discharged or charged to a maximum level. The outputs of comparators K1-K4 is sensed by logic 42, which sets the various switch and charge pump states described above with reference to FIGS. 1-3.

Charge pumps 16 and 16A are illustrated as charge pumps that receive clock (pulse) signals from logic 42, which is coupled to an oscillator 40 for providing a clock source. Logic 42 gates the clock signal from oscillator 40 independently to provide pulse signals that independently activate charge pumps 16 and 16A, when their action is needed as described above to bias the bulk and gate of transistor P1. Capacitors C40, C42 are charged when the corresponding pulse signal is in a logic high state through switch S40, S42 and then the charge is applied in opposite polarity through switch S40, S42 to an output capacitor C41, C43 which may be provided the gate and bulk capacitances of pass transistor P1. A switch S43 provides for changing the polarity of charge pump 16A in response to control logic 11 to optionally pull the bulk of transistor P1 slightly above the drain/source connection voltage levels during heavy discharge as described above.

Figure 6:
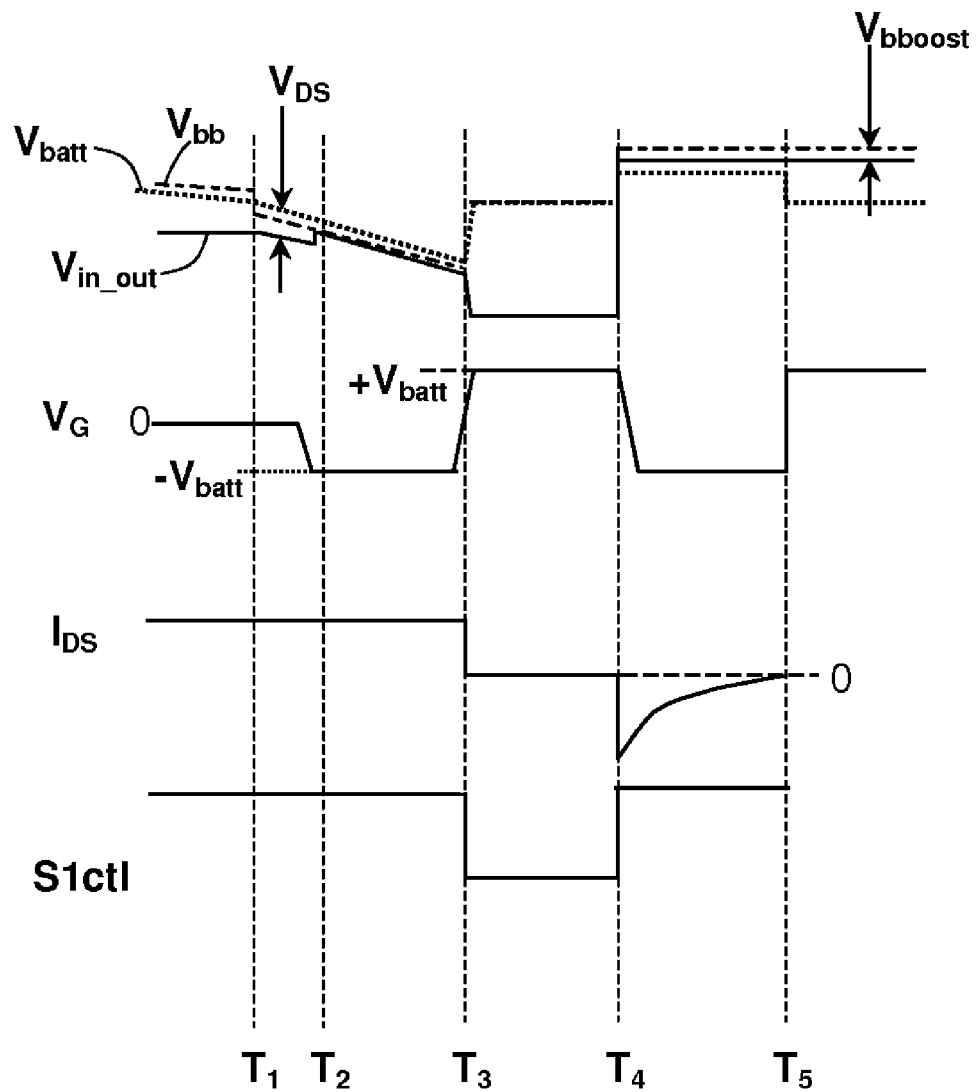
FIG. 6 is a signal diagram depicting signals within the battery protection circuits of FIGS. 1A, 1B, 2A, and 2B.

Referring now to FIG. 6, operation of the above-described circuits is depicted in a signal diagram. Prior to time T1 the battery is discharged at a low rate, but from time T1 to time T2, a higher rate of discharge begins. As the drain-source voltage $V_{DS}$ of transistor P1 increases due to the higher discharge current $I_{DS}$, the gate voltage $V_G$ is lowered at time T2 by the action of charge pump 16 in response to the detected level of $I_{DS}$ and/or $V_{DS}$. The result is that $V_{DS}$ decreases, resulting in the output voltage to the load $V_{in\_out}$ increasing slightly as shown. At time T3, control circuit 11 detects that battery 10 has become discharged to the minimum allowable value and the S1ctl signal is asserted to disable switch S1. Also, charge pump 16 is deactivated and the gate of transistor P1 is raised to the level of the battery positive terminal voltage, turning off transistor P1. At time T4, a charger is connected, switch S1 is enabled, and charge pump 16 is activated and the battery begins to charge. At time T5, control logic 11 detects that the battery has reached the maximum charge level and charge pump 16 is disabled, preventing overcharging by disabling transistor P1.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A battery protection circuit for charging a battery from a charger and discharging said battery to a load, said circuit comprising:
    a pair of battery terminals for connecting said battery;
    an input-output terminal for connecting at least one of said load and said charger;
    a pass transistor having a first drain/source connection coupled to a given one of said battery terminals and a second drain/source connection coupled to said input-output terminal;
    a charge-pump circuit having an output coupled to a gate of said pass transistor, wherein said charge pump circuit charges said gate of said pass transistor to a gate voltage such that a magnitude of a voltage between said gate of said pass transistor and said first drain/source connection is greater than a magnitude of a voltage across said battery terminals; and
    a second charge pump having an output coupled to a body of said pass transistor, for charging said body of said pass transistor to a voltage having a polarity opposite a polarity of said gate voltage with respect to both of said drain/source terminals of said pass transistor.

2. The battery protection circuit of claim 1, further comprising a current-sensing circuit for sensing a magnitude of a current provided to said load, wherein an output of said current-sensing circuit is coupled to a control input of said charge pump, and wherein said charge pump only charges said gate of said pass transistor to cause said magnitude of said gate-to-drain voltage of said pass transistor to exceed said magnitude of said voltage across said battery terminals when said magnitude of said current is greater than a threshold current level.

3. The battery protection circuit of claim 2, wherein said current-sensing circuit comprises a current mirror for mirroring a current through said pass transistor.

4. The battery protection circuit of claim 2, wherein said current-sensing circuit comprises a sense resistor coupled in series with one of said drain/source connections.

5. The battery protection circuit of claim 2, wherein said current-sensing circuit comprises a detector for detecting a level of voltage difference between said first drain/source connection and said second drain/source connection of said pass transistor.

6. The battery protection circuit of claim 1, wherein said pass transistor further comprises a bulk terminal connected to a body of said pass transistor, and wherein said circuit further comprises:
    a first resistor coupled between said given battery terminal and said bulk terminal;
    a switch coupled between said input-output terminal and said bulk terminal; and
    a control circuit coupled to a control input of said switch, wherein said switch is set to a conducting state when a charging current is supplied to said input-output terminal to charge said battery and wherein said switch is set to a non-conducting state when a discharging current is supplied from said battery to said input-output terminal.

7. The battery protection circuit of claim 6, further comprising a capacitor coupled from said bulk terminal to said gate of said pass transistor, whereby changes in a voltage of said bulk terminal due to changes in said voltage at said input-output terminal are reduced.

8. A battery protection circuit for charging a battery from a charger and discharging said battery to a load, said circuit comprising:
    a pair of battery terminals for connecting said battery;
    an input-output terminal for connecting at least one of said load and said charger;
    a pass transistor having a first drain/source connection coupled to a given one of said battery terminals and a second drain/source connection coupled to said input-output terminal;
    a first resistor connected between said given battery terminal and a bulk terminal of said pass transistor;
    a switch coupled between said input-output terminal and said bulk terminal; and
    a control circuit coupled to a control input of said switch, wherein said switch is set to a conducting state when a charging current is supplied to said input-output terminal to charge said battery and wherein said switch is set to a non-conducting state when a discharging current is supplied from said battery to said input-output terminal.

9. The battery protection circuit of claim 8, further comprising a second resistor coupled between said input-output terminal and said bulk terminal in series with said switch.

10. The battery protection circuit of claim 8, further comprising a capacitor coupled from said bulk terminal to a gate of said pass transistor, whereby changes in a voltage of said bulk terminal due to changes in a voltage at said input-output terminal are reduced.

11. A method for protecting a battery when charging said battery from a charger and discharging said battery to a load, said method comprising:
    controlling a current passing between said battery and one of said charger and said load using a pass transistor;

charging a gate of said pass transistor to a gate voltage such that a magnitude of a gate-to-drain voltage of said pass transistor is greater than a magnitude of a voltage across said battery; and charging a body of said pass transistor to a voltage having a polarity opposite a polarity of said gate voltage with respect to both drain/source terminals of said pass transistor.

12. The method of claim 11, further comprising detecting a magnitude of said current, and wherein said charging is performed only when said determining determines that said magnitude of said current is greater than said threshold.

13. The method of claim 11, further comprising:
setting a body voltage of said pass transistor by a circuit having a first resistor coupling said body to said load and a switch coupling said body to said battery; and
opening said switch when said current is passing from said battery to said load.

14. A method for protecting a battery when charging said battery from a charger and discharging said battery to a load, said method comprising:
controlling a current passing between said battery and one of said charger and load using a pass transistor;
setting a body voltage of said pass transistor by a circuit having a first resistor coupling said body to said load and a switch coupling said body to said battery;
opening said switch when said current is passing from said battery to said load; and
limiting a current through said switch with a second resistor coupled in series with said switch.

15. The method of claim 14, further comprising charging a body of said pass transistor to a voltage having a polarity opposite a polarity of said gate voltage with respect to both drain/source terminals of said pass transistor.

16. A battery protection circuit for charging a battery from a charger and discharging said battery to a load, said circuit comprising:
a pair of battery terminals for connecting said battery;
an input-output terminal for connecting at least one of said load and said charger;
a pass transistor having a first drain/source connection coupled to a given one of said battery terminals and a second drain/source connection coupled to said input-output terminal;
a charge-pump circuit having an output coupled to a gate of said pass transistor, wherein said charge pump circuit charges said gate of said pass transistor to a gate voltage such that a magnitude of a voltage between said gate of said pass transistor and said first drain/source connection is greater than a magnitude of a voltage across said battery terminals;
a first resistor connected between said given battery terminal and a bulk terminal of said pass transistor;
a switch coupled between said input-output terminal and said bulk terminal; and
a control circuit coupled to a control input of said switch, wherein said switch is set to a conducting state when a charging current is supplied to said input-output terminal to charge said battery and wherein said switch is set to a non-conducting state when a discharging current is supplied from said battery to said input-output terminal.

17. The battery protection circuit of claim 16, further comprising a second charge pump having an output coupled to a body of said pass transistor, for charging said body of said pass transistor to a voltage having a polarity opposite a polarity of said gate voltage with respect to both of said drain/source terminals of said pass transistor.

18. A method for protecting a battery when charging said battery from a charger and discharging said battery to a load, said method comprising:
controlling a current passing between said battery and one of said charger and said load using a pass transistor;
charging a gate of said pass transistor to a gate voltage such that a magnitude of a gate-to-drain voltage of said pass transistor is greater than a magnitude of a voltage across said battery; and
setting a body voltage of said pass transistor by a circuit having a first resistor coupling said body to said load and a switch coupling said body to said battery; and
opening said switch when said current is passing from said battery to said load.

19. A method for protecting a battery when charging said battery from a charger and discharging said battery to a load, said method comprising:
controlling a current passing between said battery and one of said charger and load using a pass transistor;
setting a body voltage of said pass transistor by a circuit having a first resistor coupling said body to said load and a switch coupling said body to said battery;
opening said switch when said current is passing from said battery to said load; and
charging a body of said pass transistor to a voltage having a polarity opposite a polarity of said gate voltage with respect to both drain/source terminals of said pass transistor.

* * * * *